United States Patent
Javvaji et al.

(10) Patent No.: US 11,239,831 B2
(45) Date of Patent: Feb. 1, 2022

(54) LEVEL SHIFTER

(71) Applicant: TEXAS INSTRUMENTS INCORPORATED, Dallas, TX (US)

(72) Inventors: Sundeep Lakshmana Javvaji, Addanki (IN); Vinod Joseph Menezes, Bangalore (IN); Jayateerth Pandurang Mathad, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/232,982

(22) Filed: Apr. 16, 2021

(65) Prior Publication Data

US 2021/0409010 A1   Dec. 30, 2021

(30) Foreign Application Priority Data

Jun. 24, 2020   (IN) .............................. 202041026732

(51) Int. Cl.
  *H03K 19/00*    (2006.01)
  *H03K 3/356*    (2006.01)
  *H03K 19/0185*  (2006.01)
  *H03K 19/0175*  (2006.01)

(52) U.S. Cl.
  CPC . *H03K 3/356017* (2013.01); *H03K 3/356113* (2013.01); *H03K 19/017509* (2013.01); *H03K 19/018507* (2013.01); *H03K 19/018521* (2013.01)

(58) Field of Classification Search
  None
  See application file for complete search history.

(56) References Cited

U.S. PATENT DOCUMENTS

| | | | |
|---|---|---|---|
| 6,498,738 B1* | 12/2002 | Orita | H03K 19/018521 363/73 |
| 2006/0001447 A1* | 1/2006 | De Langen | H03K 19/018528 326/80 |
| 2007/0229156 A1* | 10/2007 | Alenin | H03F 3/45291 330/252 |
| 2010/0052735 A1* | 3/2010 | Burkland | H03K 19/018521 327/66 |
| 2011/0037509 A1* | 2/2011 | Herzer | H03K 19/018521 327/333 |
| 2014/0253194 A1* | 9/2014 | Sadate | H03K 19/018521 327/170 |
| 2018/0287609 A1* | 10/2018 | Mallavajula | H03K 3/356034 |
| 2020/0267028 A1* | 8/2020 | Kattamuri | H03F 3/45183 |

* cited by examiner

*Primary Examiner* — Tuan T Lam
(74) *Attorney, Agent, or Firm* — Ray A. King; Charles A. Brill; Frank D. Cimino

(57) ABSTRACT

In an example, an apparatus includes a level-shifting circuit and a ramp detector. The level-shifting circuit has a current choke and a transistor coupled across the current choke, the level-shifting circuit adapted to be coupled to a first voltage source. The ramp detector has a ramp detector input adapted to be coupled to the first voltage source and a ramp detector output coupled to the transistor, the ramp detector adapted to be coupled to a second voltage source.

21 Claims, 4 Drawing Sheets

LEVEL SHIFTER

CROSS-REFERENCE TO RELATED APPLICATIONS

This application claims priority to Indian Provisional Patent Application No. 202041026732, which was filed Jun. 24, 2020, which is hereby incorporated herein by reference in its entirety.

BACKGROUND

A level shifter is a circuit, component, or device that translates a received input signal from a first voltage domain or logic level to a second voltage domain or logic level for providing as an output signal. The output signal may be greater in value than the input signal or lesser in value than the input signal. A level shifter may be uni-directional or bi-directional and may facilitate compatibility between components or devices that may otherwise not be compatible based on their respective voltage specifications (e.g., such as the respective voltage domains in which the components operate).

SUMMARY

In an example, an apparatus includes a level-shifting circuit and a ramp detector. The level-shifting circuit has a current choke and a transistor coupled across the current choke, the level-shifting circuit adapted to be coupled to a first voltage source. The ramp detector has a ramp detector input adapted to be coupled to the first voltage source and a ramp detector output coupled to the transistor, the ramp detector adapted to be coupled to a second voltage source.

In an example, an apparatus includes a ramp detector and a level-shifting circuit. The ramp detector is configured to detect a slew rate of a voltage source, determine whether the slew rate of the voltage source exceeds a programmed amount, and provide an output signal having an asserted value responsive to the slew rate of the voltage source exceeding the programmed amount. The level-shifting circuit is coupled to the voltage source and the ramp detector. The level-shifting circuit configured to limit a quiescent current of the level-shifting circuit via a current choke while the slew rate of the voltage source does not exceed the programmed amount, and bypass the current choke responsive to the output signal having the asserted value.

In an example, a system includes a first component, a second component, and a level shifter. The first component has a first component input, the first component configured to operate in a first voltage domain defined according to a first voltage source. The second component has a second component output, the second component configured to operate in a second voltage domain defined according to a second voltage source. The level shifter includes a ramp detector and a level-shifting circuit. The ramp detector is configured to detect a slew rate of the first voltage source, determine whether the slew rate of the first voltage source exceeds a programmed amount, and provide an output signal having an asserted value responsive to the slew rate of the first voltage source exceeding the programmed amount. The level-shifting circuit has a level-shifting circuit input coupled to the second component output and a level-shifting circuit output coupled to the first component input, the level-shifting circuit also coupled to the first voltage source and the ramp detector. The level-shifting circuit is configured to convert a signal provided by the second component from the second voltage domain to the first voltage domain and provide the signal according to the second voltage domain to the first component, limit a quiescent current of the level-shifting circuit via a current choke while the slew rate of the first voltage source does not exceed the programmed amount, and bypass the current choke responsive to the output signal having the asserted value.

In an example, an apparatus includes a level-shifting circuit and a ramp detector. The level-shifting circuit includes a first arm including a first portion of a cross-coupled latch, a first diode-coupled transistor stack, and a first input transistor, and a second arm including a second portion of the cross-coupled latch, a second diode-coupled transistor stack, and a second input transistor. The level-shifting circuit also includes a first current choke adapted to be coupled between the first input transistor and ground, and a second current choke adapted to be coupled between the second input transistor and ground. The level-shifting circuit also includes a first shorting transistor adapted to be coupled across the first current choke between the first input transistor and ground, and a second shorting transistor adapted to be coupled across the second current choke between the second input transistor and ground. The ramp detector has a capacitor coupled via a current mirror to the first shorting transistor and the second shorting transistor. The ramp detector also has a grounded gate transistor coupled to the capacitor.

DETAILED DESCRIPTION

Figure 1:
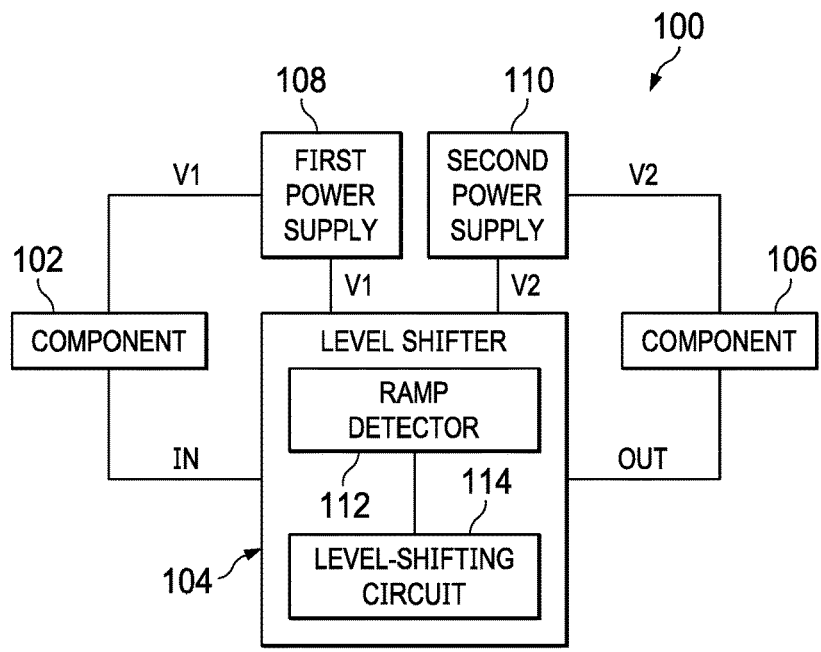
FIG. 1 is a block diagram of an example system.

As described above, a level shifter may facilitate voltage compatibility between components that may otherwise operate in voltage domains or voltage ranges that are incompatible with one another. In some examples, the voltage domains are low voltage and high voltage domains, respectively. For example, the low voltage domain may have an upper limit of less than or equal to about 5 volts (V) and the high voltage domain may have upper and lower limits in a range from about 2.5 V to about 70 V, respectively, resulting from potential voltage transients in the high voltage domain. In various other examples, other suitable voltage ranges are possible for the low voltage domain and/or the high voltage domain. For example, the low voltage domain may have an upper limit of less than or equal to about 1.2 V, 1.8 V, 3.3 V, or any other suitable amount. In designing a level shifter usable with the high voltage domain, certain tradeoffs may occur. For example, the level shifter may be designed to facilitate an output (OUT) signal having a lower limit that swings between multiple values to account for gate oxide voltage of transistors of the level shifter. The level shifter may also be designed to have a low current consumption, such as less than about 100 nanoamps (nA) to reduce a quiescent current (IQ) of the level shifter, which may have a tradeoff of limiting a slew rate of the OUT signal. The level shifter may also be designed to account for comparatively large parasitic values (e.g., capacitance and/or inductance) of components that operate in the high voltage domain, which may have a tradeoff of reducing transient performance of the level shifter. To accommodate operation in the low voltage domain and the high voltage domain, the level shifter may receive a low source voltage and a high source voltage, respectively. The low source voltage may have any suitable value within the low voltage domain. The high source voltage may have any suitable value within the high voltage domain, but may also experience transient events in which the value of the high source voltage may unpredictably or unexpectedly vary to any other value within the high voltage domain. These transient events, if left uncompensated for, may cause damage to the level shifter and/or may alter designed functionality or operation of the level shifter.

A level shifter according to this description at least partially mitigates the effects of and/or compensates for these transient events. In at least one implementation, the level shifter includes current chokes to limit IQ of the level-shifter and includes components (such as transistors) coupled across the current chokes to short the current chokes, increasing a transient response of the level shifter, responsive to detection of voltage transients in a voltage supply of the level shifter that exceed a voltage transient threshold. For example, the level shifter may modify its operation, such as with respect to providing of the OUT signal, based on the value of the high source voltage. Such modified operation may maintain a voltage across at least one transistor coupled to the level shifter (e.g., such as driven by the level shifter) within specified operational tolerances of the transistor. For example, the modified operation of the level shifter may maintain a voltage provided by the level shifter to a transistor coupled to and receiving an output of the level shifter within a specified tolerance range for a gate oxide voltage of the transistor while also providing for reduced IQ operation of the level shifter. The modified operation may also control a signal pull-down strength of the level shifter, such as provided by a current source, to modify a discharge rate of the OUT signal (e.g., such as to increase a response time in the presence of certain voltage transients). The level shifter may include a ramp detector that monitors a rate of change of the value of the high source voltage. In some examples, the monitoring provides an indication of, or information related to, voltage transients present in the high source voltage. In at least some examples, the ramp detector includes a rising value or rise detector and a falling value or fall detector. Responsive to the rate of change of the value (e.g., slew rate) of the high source voltage exceeding a programmed amount, in a positive or negative direction, the level shifter may increase a pull-down current to increase a discharge rate of the OUT signal, increasing a falling slew rate of the OUT signal, or of OUTBAR (e.g., an inverse of the OUT signal), increasing a falling slew rate of OUTBAR and therefore increasing a charging rate of the OUT signal. Conversely, responsive to the slew rate of the high source voltage not exceeding the programmed amount, the pull-down current of the level shifter may be limited to a programmed value to reduce and/or control IQ of the level shifter. In at least some examples, determining whether the slew rate of the high source voltage exceeds the programmed amount is performed by comparing a current representative of the slew rate of the high source voltage to a reference current representative of the programmed value.

FIG. 1 shows a block diagram of an example system 100. In at least some examples, the system 100 is representative of an automobile or other vehicular environment in which certain components may operate in, or according to, a first voltage domain and other components may operate in, or according to, a second voltage domain. For example, the system 100 may include a component 102, a level shifter 104, and a component 106. The system 100 may also include, or be adapted to be coupled to a first power supply 108 and a second power supply 110. In at least some examples, the component 102 receives power from the first power supply 108 and operates in the first voltage domain. Similarly, the component 106 receives power from the second power supply 110 and operates in the second voltage domain. In some implementations, the second power supply 110 is a vehicle battery. Generally, the component 102 and the component 106 may not be interoperable with one another resulting from their operation in different voltage domains. For example, a digital output signal provided by the component 102 having a first value may be interpreted by the component 106 as having a value other than the first value resulting from the component 102 and the component 106 operating in different voltage domains.

To provide interoperability between the component 102 and the component 106, in at least some examples, the level shifter 104 is adapted to be coupled between the component 102 and the component 106, as well as adapted to be coupled to both the first power supply 108 and the second power supply 110. The level shifter 104 may translate between the first voltage domain and the second voltage domain. For example, in some implementations the level shifter 104 receives an input signal from the component 102 having a value specified according to the first voltage domain and provides an output signal to the component 106 having a value specific according to the second voltage domain. In this way, if the value specified according to the first voltage domain is a first digital value, the value specific according to the second voltage domain is also the first digital value. Similarly, if the value specified according to the first voltage domain is a second digital value, the value specific according to the second voltage domain is also the second digital value.

In some examples, the second power supply 110 is susceptible to voltage transients, such as when the second power supply 110 is a battery in a vehicular environment. For example, the second power supply 110 may be susceptible to voltage transients ranging from about 2.5 V to about 70 V, or any other suitable values (such as negative values), such as caused by the effects of loading on the second power supply 110. To mitigate effects of these voltage transients on operation of the level shifter 104 the level shifter 104 may include a ramp detector 112 and a level-shifting circuit 114. In some examples, the ramp detector 112 detects a slew rate of a signal received from the second power supply 110 and, responsive to determining that the slew rate exceeds a programmed amount, provides an output signal having an asserted pulse to the level-shifting circuit 114. To reduce IQ of the level-shifting circuit 114, and therefore increase an energy efficiency of the level-shifting circuit 114, and the level shifter 104, the level-shifting circuit 114 may include current limiting components (not shown) configured to limit a current flow through the level-shifting circuit 114. In at least some examples, responsive to the level-shifting circuit 114 receiving the signal having the asserted pulse from the ramp detector 112, the level-shifting circuit 114 bypasses or shunts the current limiting components. In some examples, for approximately the period of time for which the current limiting components are shunted, IQ of the level-shifting circuit 114, and the level shifter 104, increases with respect to IQ of the level-shifting circuit 114, and the level shifter 104, while the current limiting components are not shunted. Shunting the current limiting components, in at least some examples, increases a rate at which an output signal of the level-shifting circuit 114 (e.g., the OUT signal) discharges. By increasing the rate at which the output signal of the level-shifting circuit 114 discharges, effects of the transient components of the second power supply 110 on the level shifter 104, and operation of the system 100, are mitigated.

Figure 2:
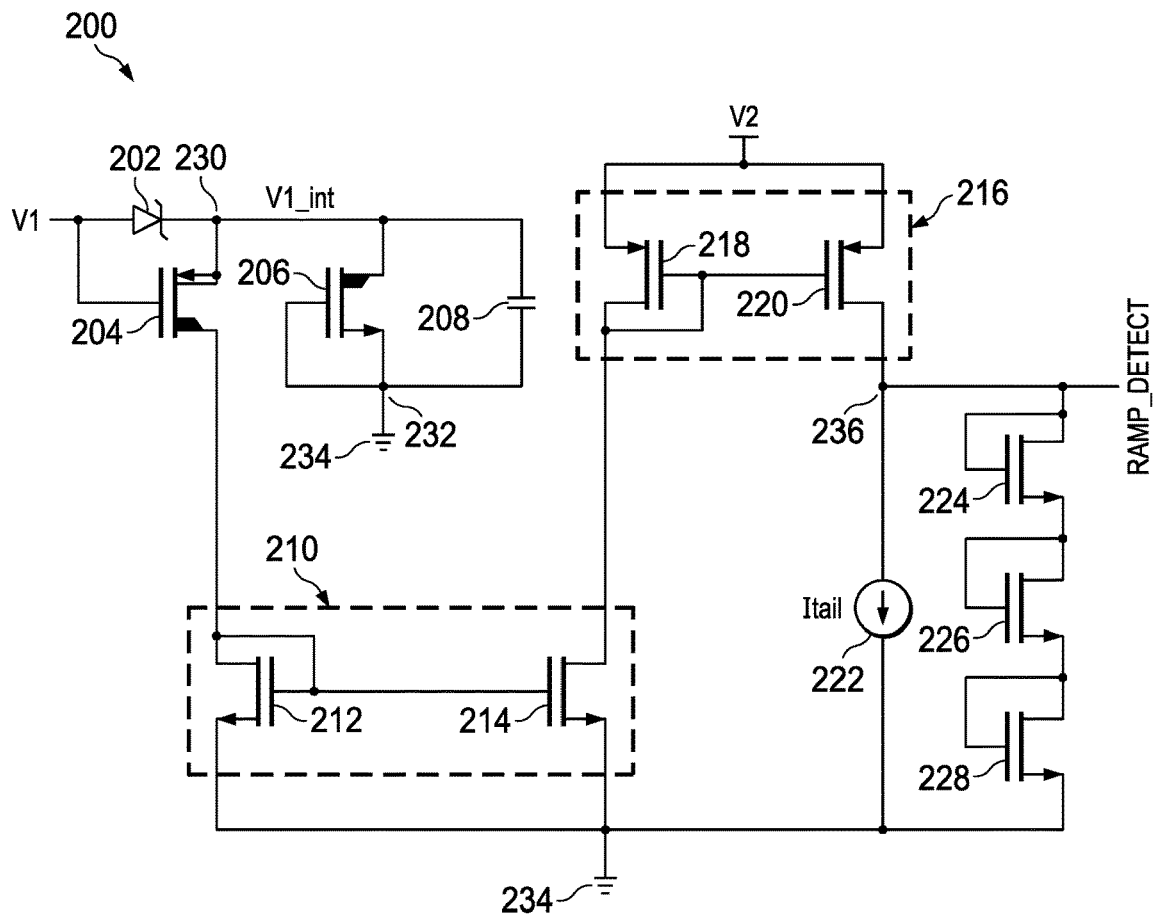
FIG. 2 is a schematic diagram of an example rise detector.

FIG. 2 shows a schematic diagram of an example fall detector 200. In at least some examples, the fall detector 200 is, or is a component of, the ramp detector 112 of FIG. 1. For example, the fall detector 200 may detect a falling slew rate of a received signal and provide a signal having an asserted pulse responsive to the falling slew rate exceeding a programmed amount. In at least some examples, the fall detector 200 includes a diode 202, a transistor 204, a transistor 206, a capacitor 208, a current mirror 210 that includes a transistor 212 and a transistor 214, a current mirror 216 that includes a transistor 218 and a transistor 220, a current source 222, a transistor 224, a transistor 226, and a transistor 228. In at least some examples, the diode 202 is a Zener diode. In some examples, the capacitor 208 is a high-voltage capacitor. In some examples, the transistor 204 and the transistor 206 are each drain-extended, or other high-voltage process technology, transistors.

In an example architecture of the fall detector 200, the diode 202 has an anode adapted to be coupled to a first voltage source (not shown) and receive a first voltage signal (V1). The diode 202 also has a cathode coupled to a node 230. The transistor 204 has a gate coupled to the anode of the diode 202, a source coupled to the node 230, and a drain coupled to a node 232. The transistor 206 has a drain coupled to the node 230 and a gate and a source adapted to be coupled to ground 234. The capacitor 208 is coupled between the node 230 and ground 234. The current mirror 210 is coupled between the drain of the transistor 204 and the current mirror 216. For example, the transistor 212 has a gate and a drain coupled to the drain of the transistor 204 and a source adapted to be coupled to ground 234. The transistor 214 has a gate coupled to the gate of the transistor 212 and a source adapted to be coupled to ground 234. The current mirror 216 is coupled between the current mirror 210 (e.g., at a drain of the transistor 214) and a node 236. For example, the transistor 218 has a gate and a drain coupled to the drain of the transistor 214 and a source adapted to be coupled to a second voltage source (not shown) and receive a second voltage signal (V2). The transistor 220 has a gate coupled to the gate of the transistor 218, a source adapted to be coupled to the second voltage source and receive V2, and a drain coupled to the node 236. The current source 222 is adapted to be coupled, and conduct current, between the node 236 and ground 234. The transistor 224, the transistor 226, and the transistor 228 are each adapted to be coupled in series in a diode-connected configuration between the node 236 and ground 234. In at least some examples, any one or more of the transistor 224, the transistor 226, and/or the transistor 228 may be omitted from the fall detector 200 or replaced by any other suitable safety or voltage clamping component or circuit.

In an example of operation of the fall detector 200, V1 is received at the anode of the diode 202. Current of V1 flows through the diode 202 and provides a signal (V1_int) at the node 230. In at least some examples, a value of V1_int follows that of V1, minus a voltage drop of the diode 202, during falling transients of V1. Otherwise, a gate to source voltage (Vsg) of the transistor 204 increases, increasing a pull-down strength of the transistor 204. The transistor 206 is coupled in such a configuration as to provide a parasitic capacitance in parallel with the capacitor 208, increasing an effective capacitance at the node 230. In at least some examples, the transistor 206 is referred to as a grounded gate transistor, or a transistor that is coupled in a grounded gate configuration. The capacitor 208 charges based on V1_int and during falling transients of V1 provides a current (Icap) having a value approximately equal to a capacitance (C) of the capacitor 208 multiplied by a rate of change of V1 with respect to time $$\left(\frac{dV1}{dt}\right).$$

Icap is mirrored by the current mirror 210 to the current mirror 216. In at least some examples, the current mirror 216 is a 1:n current mirror such that the transistor 220 has a size n times larger than the transistor 218. The current mirror 216 mirrors Icap to the node 236 to provide n*Icap at the node 236. The current source 222 is configured to sink a programmed amount of current (Itail) from the node 236 to ground 234. Responsive to n*Icap being greater in value than Itail, a ramp detection signal (RAMP_DETECT) is provided at the node 236 having a voltage approximately equal to V2, minus a voltage drop provided by the transistor 220. Responsive to n*Icap being lesser in value than Itail, RAMP_DETECT is provided at the node 236 having a voltage approximately equal to a voltage provided at ground 234. The transistor 224, the transistor 226, and the transistor 228, in at least some examples, clamp a value of a voltage of RAMP_DETECT to be no greater than approximately a sum of threshold voltages of the transistor 224, the transistor 226, and the transistor 228. In at least some examples, by increasing the value of n, the value of C may be decreased, decreasing a physical size of the fall detector 200 in comparison to a physical size of the fall detector 200 with a smaller value of n and a larger value of C.

Figure 3:
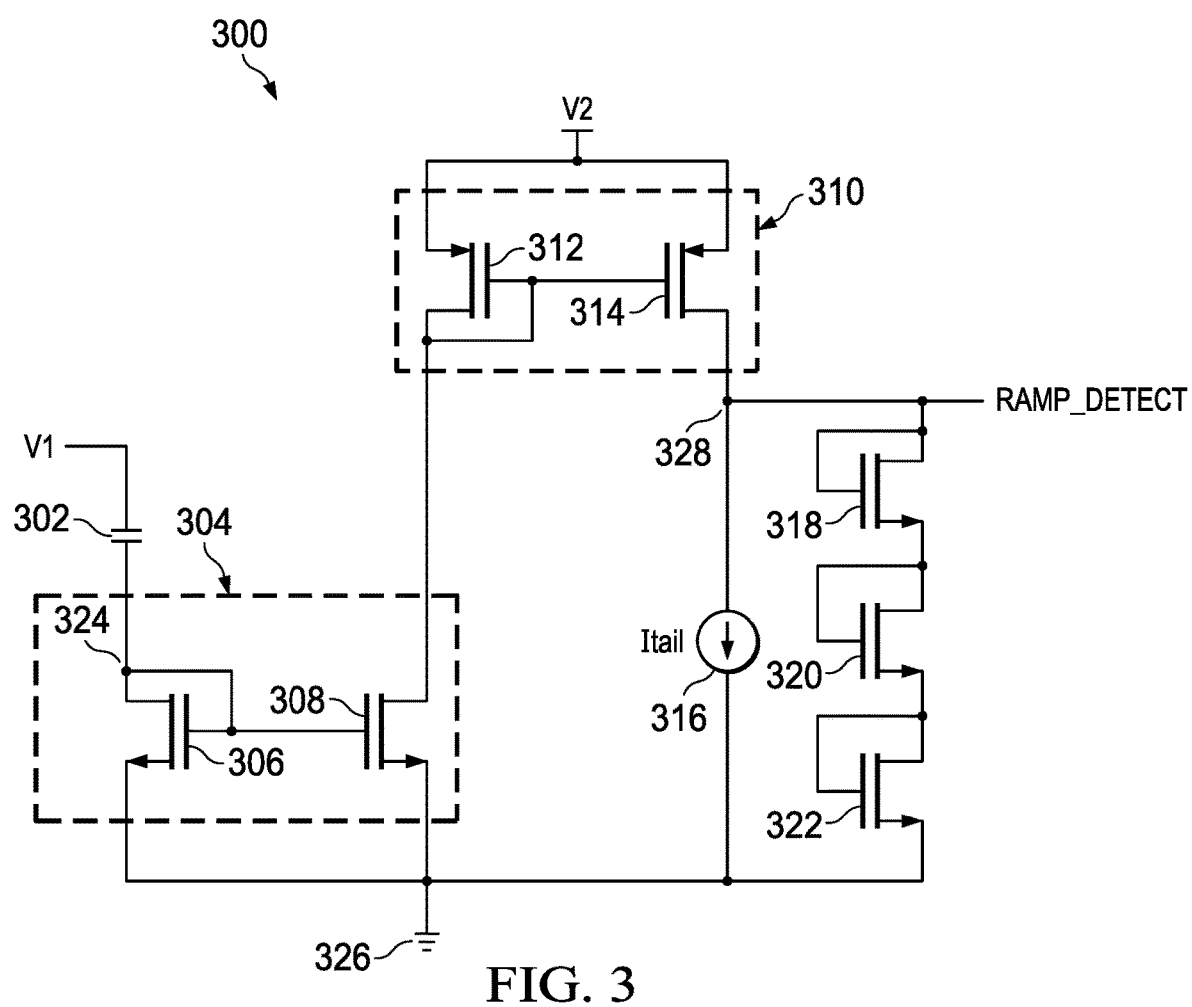
FIG. 3 is a schematic diagram of an example fall detector.

FIG. 3 shows a schematic diagram of an example rise detector 300. In at least some examples, the rise detector 300 is, or is a component of, the ramp detector 112 of FIG. 1. For example, the rise detector 300 may detect a rising slew rate of a received signal and provide a signal having an asserted pulse responsive to the rising slew rate exceeding a programmed amount. In at least some examples, the rise detector 300 includes a capacitor 302, a current mirror 304 that includes a transistor 306 and a transistor 308, a current mirror 310 that includes a transistor 312 and a transistor 314, a current source 316, a transistor 318, a transistor 320, and a transistor 322. In some examples, the capacitor 302 is a high-voltage capacitor.

In an example architecture of the rise detector 300, the capacitor 302 has a first terminal adapted to be coupled to a first voltage source (not shown) and receive V1, and a second terminal is coupled to a node 324. The current mirror 304 is coupled between the node 324 and the current mirror 310. For example, the transistor 306 has a gate and a drain coupled to the node 324 and a source adapted to be coupled to ground 326. The transistor 308 has a gate coupled to the gate of the transistor 306 and a source adapted to be coupled to ground 326. The current mirror 310 is coupled between the current mirror 304 (e.g., at a drain of the transistor 308) and a node 328. For example, the transistor 312 has a gate and a drain coupled to the drain of the transistor 308 and a source adapted to be coupled to a second voltage source (not shown) and receive V2. The transistor 314 has a gate coupled to the gate of the transistor 312, a source adapted to be coupled to the second voltage source and receive V2, and a drain coupled to the node 328. The current source 316 is adapted to be coupled, and conduct current, between the node 328 and ground 326. The transistor 318, the transistor 320, and the transistor 322 are each adapted to be coupled in series in a diode-connected configuration between the node 328 and ground 326. In at least some examples, any one or more of the transistor 318, the transistor 320, and/or the transistor 322 may be omitted from the rise detector 300 or replaced by any other suitable safety or voltage clamping component or circuit.

In an example of operation of the rise detector 300, the capacitor 302 charges based on V1 and during rising transients of V1 provides Icap at the node 324 having a value approximately equal to a capacitance (C) of the capacitor 302 multiplied by a rate of change of V1 with respect to time $$\left(\frac{dV1}{dt}\right).$$

Icap is mirrored by the current mirror 304 to the current mirror 310. In at least some examples, the current mirror 310 is a 1:n current mirror such that the transistor 314 has a size n times larger than the transistor 312. The current mirror 310 mirrors Icap to the node 328 to provide n*Icap at the node 328. The current source 316 is configured to sink a programmed amount of current (Itail) from the node 328 to ground 326. Responsive to n*Icap being greater in value than Itail, RAMP_DETECT is provided at the node 328 having a voltage approximately equal to V2, minus a voltage drop provided by the transistor 314. Responsive to n*Icap being lesser in value than Itail, RAMP_DETECT is provided at the node 328 having a voltage approximately equal to a voltage provided at ground 326. The transistor 318, the transistor 320, and the transistor 322, in at least some examples, clamp a value of a voltage of RAMP_DETECT to be no greater than approximately a sum of threshold voltages of the transistor 318, the transistor 320, and the transistor 322. In at least some examples, by increasing the value of n, the value of C may be decreased, decreasing a physical size of the rise detector 300 in comparison to a physical size of the rise detector 300 with a smaller value of n and a larger value of C.

Figure 4:
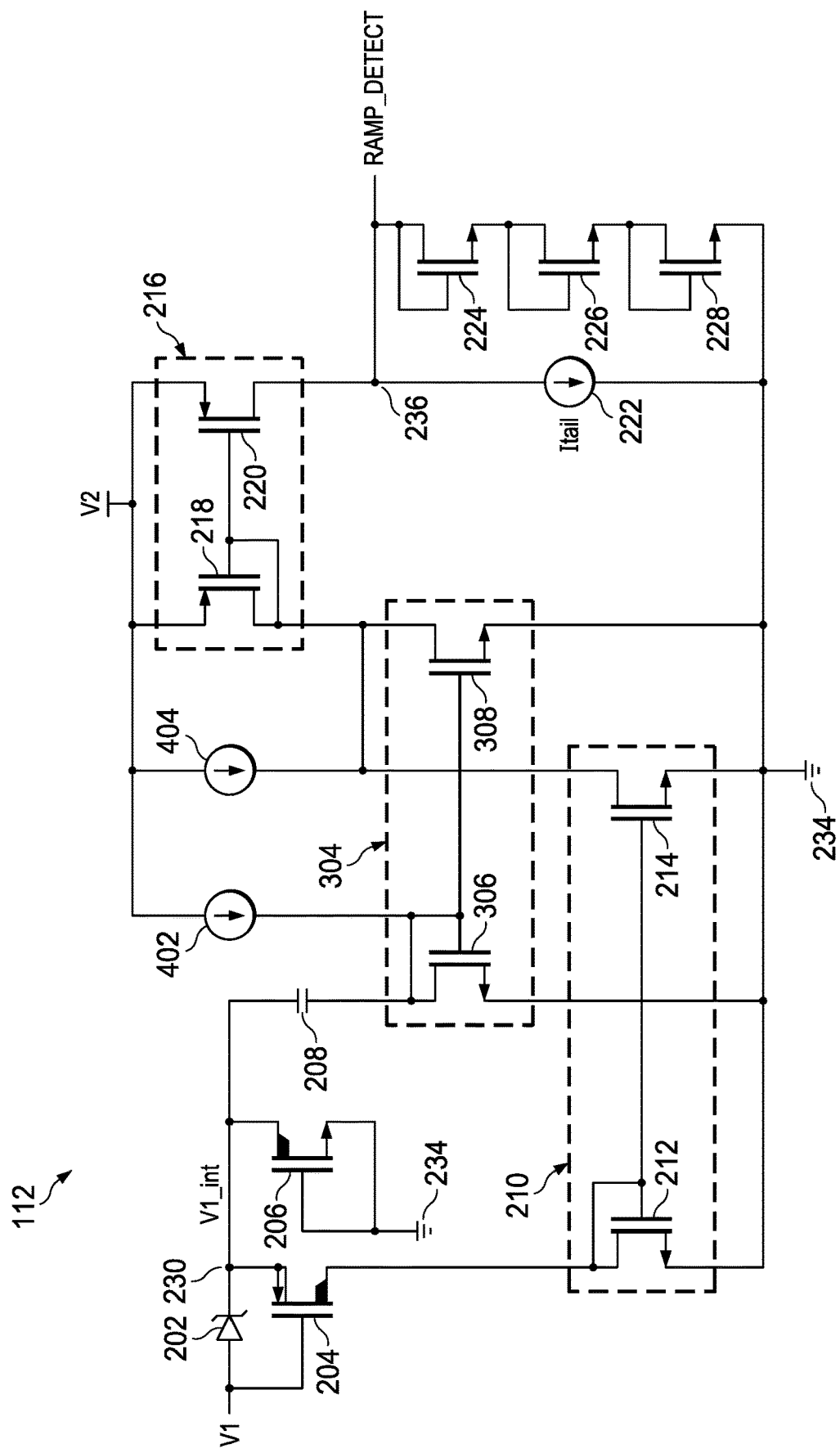
FIG. 4 is a schematic diagram of an example ramp detector.

FIG. 4 shows a schematic diagram of an example ramp detector 112. In at least some examples, the ramp detector 112 combines the fall detector 200 of FIG. 2 and the rise detector 300 of FIG. 3 such that the ramp detector 112 detects and provides a signal responsive to rising and/or falling transients in V1. For example, the ramp detector 112 includes the components of the fall detector 200 and the current mirror 304 (including the transistor 306 and the transistor 308) of the rise detector 300. In at least some examples, the capacitor 208 and the capacitor 302 are shared as the same component, the current mirror 216 including transistors 218 and 220 are shared as the same components as the current mirror 310 including transistors 312 and 314, respectively, the current source 222 and the current source 316 are shared as the same component, and the transistor 224, the transistor 226, and the transistor 228 are shared as the same components as the transistor 318, the transistor 320, and the transistor 322, respectively. In at least some implementations, the ramp detector 112 also includes a current source 402 adapted to be coupled between the second voltage source and the gate of the transistor 306 and a current source 404 adapted to be coupled between the second voltage source and the drain of the transistor 214. The current source 402 and the current source 404 each provide respective bias currents to the ramp detector 112 to mitigate the existence of floating nodes in the ramp detector 112. In at least some examples, outputs of the current mirror 210 and the current mirror 304 are summed at the current mirror 216, such as by shorting current pulldown arms of the current mirror 210 (e.g., at the drain of the transistor 214) and the current mirror 304 (e.g., at a drain of the transistor 308) at a current pullup arm of the current mirror 216 (e.g., at a drain of the transistor 220). Further description of the ramp detector 112 is not included herein with respect to FIG. 4, and reference is instead made to the architecture and operation descriptions above with respect to FIG. 2 and FIG. 3.

Figure 5:
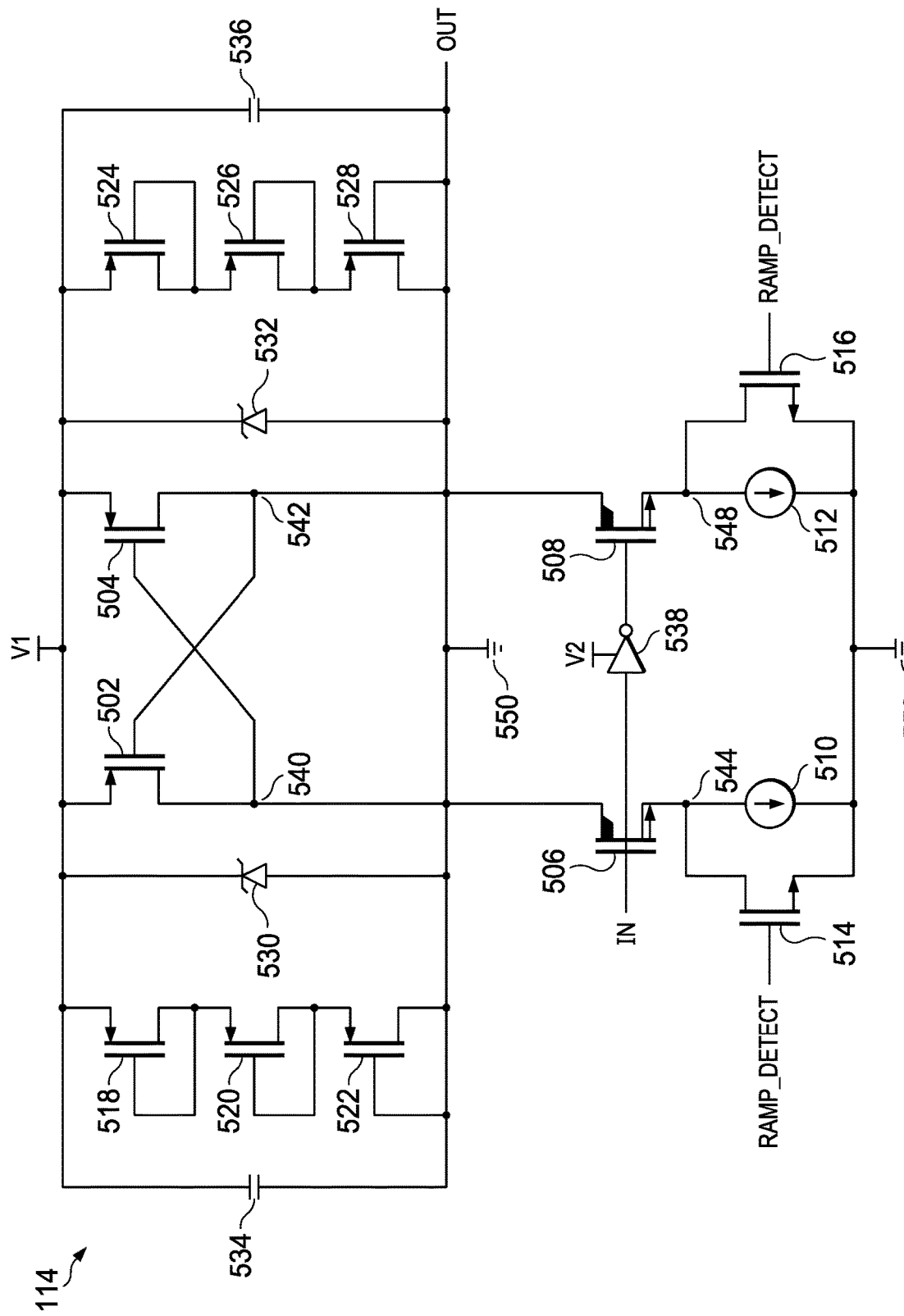
FIG. 5 is a schematic diagram of an example level shifting circuit.

FIG. 5 shows a schematic diagram of an example level-shifting circuit 114. In at least some examples, the level-shifting circuit 114 is configured to receive an input signal (IN) in a first voltage domain defined according to V2 and provide the OUT signal in a second voltage domain defined according to V1. In at least some examples, the level-shifting circuit 114 includes a transistor 502, a transistor 504, a transistor 506, a transistor 508, a current source 510, a current source 512, a transistor 514, a transistor 516, a transistor 518, a transistor 520, a transistor 522, a transistor 524, a transistor 526, a transistor 528, a diode 530, a diode 532, a capacitor 534, a capacitor 536, and an inverter 538. In some implementations, the transistor 506 and the transistor 508 are each drain-extended transistors. In some implementations, the diode 530 and the diode 532 are each Zener diodes. In at least some examples, the current source 510 and the current source 512 are each referred to as a current choke.

In an example architecture of the level-shifting circuit 114, the transistor 502 and the transistor 504 form a cross-coupled latch such that the level-shifting circuit 114 includes two complementary arms. For example, the transistor 502 has a source adapted to be coupled to a voltage source (not shown) that provides V1, a gate coupled to a node 540, and a drain coupled to a node 542. The transistor 504 has a source adapted to be coupled to the voltage source that provides V1, a gate coupled to the node 542, and a drain coupled to the node 540. The transistor 506 has a drain coupled to the node 540, a source coupled to a node 544, and a gate configured to receive IN. The inverter 538 has an input terminal coupled to the gate of the transistor 506, an output terminal coupled to a gate terminal of the transistor 508, and operates in the first voltage domain based on receiving V2. The transistor 508 also has a drain coupled to the node 540 and a source coupled to a node 548. The current source 510 is adapted to be coupled between the node 544 and ground 550. The current source 512 is adapted to be coupled between the node 548 and ground 550. The transistor 514 has a drain coupled to the source of the transistor 506, a source adapted to be coupled to ground 550, and a gate configured to receive RAMP_DETECT as described above. The transistor 516 has a drain coupled to the source of the transistor 508, a source adapted to be coupled to ground 550, and a gate configured to receive RAMP_DETECT as described above. In at least some examples, the node 540 and the node 542 are adapted to be coupled to ground 550 such that a parasitic capacitance (not shown) of the transistor 506 exists between the drain of the transistor 506 and ground 550 and a parasitic capacitance (not shown) of the transistor 508 exists between the drain of the transistor 508 and ground 550. The transistor 518, the transistor 520, and the transistor 522 are each adapted to be coupled in series in a diode-connected configuration between the voltage source and the node 540. The transistor 524, the transistor 526, and the transistor 528 are each adapted to be coupled in series in a diode-connected configuration between the voltage source and the node 542. The diode 530 has a cathode adapted to be coupled to the voltage source and an anode coupled to the node 540. The diode 532 has a cathode adapted to be coupled to the voltage source and an anode coupled to the node 542. The capacitor 534 is adapted to be coupled between the voltage source and the node 540. The capacitor 536 is adapted to be coupled between the voltage source and the node 542. In at least some examples, any one or more of the transistor 518, the transistor 520, and/or the transistor 522 may be omitted from the level-shifting circuit 114 or additional diode-coupled transistors may be added in series with the transistor 518, the transistor 520, and the transistor 522. In at least some examples, any one or more of the transistor 524, the transistor 526, and/or the transistor 528 may be omitted from the level-shifting circuit 114 or additional diode-coupled transistors may be added in series with the transistor 524, the transistor 526, and the transistor 528. In some examples, the diode 530 and the diode 532 may be omitted from the level-shifting circuit 114. In some examples, the capacitor 534 and the capacitor 536 may be omitted from the level-shifting circuit 114.

In an example of operation of the level-shifting circuit 114, responsive to IN being received having a value sufficient to cause the transistor 506 to conduct current between its drain and source, the transistor 506 pulls down the node 540 with a current approximately equal to a current sunk by the current source 510 and the transistor 508 is non-conductive. While the node 540 is pulled down by the transistor 506, a voltage provided at the node 540 may be approximately equal to V1 minus a voltage drop provided by the transistor 518, the transistor 520, and the transistor 522 (e.g., such as a sum of threshold voltages of the transistor 518, the transistor 520, and the transistor 522). Responsive to the node 540 being pulled down, the transistor 504 becomes conductive and pulls up the node 542 to provide the OUT signal having a value of approximately V1 minus a voltage loss provided by the transistor 504. Responsive to IN being received having a value insufficient to cause the transistor 506 to conduct current between its drain and source, the transistor 506 is non-conductive and the transistor 508 pulls down the node 542 with a current approximately equal to a current sunk by the current source 512. While the node 542 is pulled down by the transistor 508, a voltage provided at the node 542 as the OUT signal may be approximately equal to V1 minus a voltage drop provided by the transistor 524, the transistor 526, and the transistor 528 (e.g., such as a sum of threshold voltages of the transistor 524, the transistor 526, and the transistor 528). Responsive to the node 542 being pulled down, the transistor 502 becomes conductive and pulls up the node 540 to have a value of approximately V1 minus a voltage loss provided by the transistor 502.

In at least some examples, IQ of the level-shifting circuit 114 may be limited to a programmed value for which the current source 510 and the current source 512 are configured to sink to ground 550. In some circumstances, such as in the presence of transients in V1, the parasitic capacitances of the transistor 506 and the transistor 508 hold values of the node 540 and the node 542 at values that were provided prior to the transients in V1. In some examples, this may result in the OUT signal having an incorrect value with respect to IN, potentially altering functionality or operation of a system, such as the system 100, circuit, such as the level shifter 104, or apparatus that includes the level-shifting circuit 114. In at least some examples, RAMP_DETECT is asserted responsive to the transients in V1 exceeding a programmed amount, as described above. Responsive to assertion of RAMP_DETECT, the current source 510 and the current source 512 are bypassed or shunted, removing the IQ limit placed on the level-shifting circuit 114 by the current source 510 and the current source 512. Removing the IQ limit placed on the level-shifting circuit 114 by the current source 510 and the current source 512 increases a rate at which the parasitic capacitances of the transistor 506 and/or the transistor 508 discharge, preventing the OUT signal from having an incorrect value with respect to IN, as described above, resulting from the transients in V1. In at least some examples, the transients in V1 have a slew rate of about 1 V per microsecond (us) (1 V/us). In at least some examples, the current source 510 and the current source 512 are each configured to sink a current of less than or equal to about 20 nA.

In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described examples, and other examples are possible, within the scope of the claims.

What is claimed is:

1. An apparatus, comprising:
   a level-shifting circuit having a current choke and a transistor coupled across the current choke, the level-shifting circuit adapted to be coupled to a first voltage source; and
   a ramp detector having a ramp detector input adapted to be coupled to the first voltage source and a ramp detector output coupled to the transistor, the ramp detector adapted to be coupled to a second voltage source.

2. The apparatus of claim 1, wherein the current choke is a first current choke, the transistor is a first transistor, and the level-shifting circuit includes:
   a first arm that includes a second transistor that is a first portion of a cross-coupled latch, the first current choke, the first transistor, a third transistor, and a first diode-coupled transistor stack; and
   a second arm that includes a fourth transistor that is a second portion of the cross-coupled latch, a second current choke, a fifth transistor, a sixth transistor, and a second diode-coupled transistor stack.

3. The apparatus of claim 2, wherein the second transistor has a source adapted to be coupled to the first voltage source, the fourth transistor has a source adapted to be coupled to the first voltage source, a gate coupled to a drain of the second transistor, and a drain coupled to a gate of the second transistor, the third transistor has a drain coupled to the drain of the second transistor, the fifth transistor has a drain coupled to the drain of the fourth transistor, the first current choke is adapted to be coupled between a source of the third transistor and ground, the second current choke is adapted to be coupled between the source of the fifth transistor and ground, the first transistor has a drain coupled to the source of the third transistor and a source adapted to be coupled to ground, and the sixth transistor has a drain coupled to the source of the fifth transistor and a source adapted to be coupled to ground.

4. The apparatus of claim 3, wherein the first transistor and the sixth transistor are each configured to receive a signal that has an asserted value responsive to a slew rate of the first voltage source exceeding a programmed amount, the asserted value being sufficient to cause the first transistor and the sixth transistor to conduct current.

5. The apparatus of claim 1, wherein the ramp detector includes:
   a diode having an anode adapted to be coupled to the first voltage source and a cathode;
   a seventh transistor having a gate coupled to the anode of the diode, a source coupled to the cathode of the diode, and a drain;
   an eighth transistor having a gate and a source adapted to be coupled to ground and a source coupled to the cathode of the diode;
   a capacitor having a first terminal coupled to the cathode of the diode;
   a first current mirror having a first current mirror input coupled to drain of the seventh transistor, and a first current mirror output;
   a second current mirror having a second current mirror input coupled to the first current mirror output and a second current mirror output, the second current mirror adapted to be coupled to the second voltage source; and
   a current source coupled between the second current mirror output and ground, the second current mirror output coupled to the transistor.

6. The apparatus of claim 5, wherein the capacitor has a second terminal and the ramp detector includes a third current mirror having a third current mirror input coupled to the second terminal of the capacitor and a third current mirror output coupled to the second current mirror input.

7. The apparatus of claim 1, wherein the ramp detector includes:
   a capacitor having a first terminal adapted to be coupled to the first voltage source, and a second terminal;
   a first current mirror having a first current mirror input coupled to the second terminal of the capacitor, and a first current mirror output;
   a second current mirror having a second current mirror input coupled to the first current mirror output, and a second current mirror output, the second current mirror adapted to be coupled to the second voltage source; and
   a current source coupled between the second current mirror output and ground, the second current mirror output coupled to the transistor.

8. An apparatus, comprising:
   a ramp detector configured to:
      detect a slew rate of a voltage source;
      determine whether the slew rate of the voltage source exceeds a programmed amount; and
      provide an output signal having an asserted value responsive to the slew rate of the voltage source exceeding the programmed amount; and
   a level-shifting circuit coupled to the voltage source and the ramp detector, the level-shifting circuit configured to:
      limit a quiescent current of the level-shifting circuit via a current choke while the slew rate of the voltage source does not exceed the programmed amount; and
      bypass the current choke responsive to the output signal having the asserted value.

9. The apparatus of claim 8, wherein the current choke is a first current choke, and the level-shifting circuit includes:
   a first arm that includes a first transistor that is a first portion of a cross-coupled latch, a second transistor, the first current choke, a third transistor, and a first diode-coupled transistor stack; and
   a second arm that includes a fourth transistor that is a second portion of the cross-coupled latch, a fifth transistor, a second current choke, a sixth transistor, and a second diode-coupled transistor stack.

10. The apparatus of claim 9, wherein the first transistor has a source adapted to be coupled to the voltage source, the fourth transistor has a source adapted to be coupled to the voltage source, a gate coupled to a drain of the first transistor, and a drain coupled to a gate of the first transistor, the second transistor has a drain coupled to the drain of the first transistor, the fifth transistor has a drain coupled to the drain of the fourth transistor, the first current choke is adapted to be coupled between a source of the second transistor and ground, the second current choke is adapted to be coupled between the source of the fifth transistor and ground, the third transistor has a drain coupled to the source of the second transistor and a source adapted to be coupled to ground, and the sixth transistor has a drain coupled to the source of the fifth transistor and a source adapted to be coupled to ground.

11. The apparatus of claim 10, wherein the third transistor and the sixth transistor are each configured to receive a signal that has an asserted value responsive to a slew rate of the voltage source exceeding a programmed amount, the asserted value being sufficient to cause the third transistor and the sixth transistor to conduct current to bypass the first current choke and the second current choke.

12. The apparatus of claim 9, wherein the voltage source is a first voltage source, and the ramp detector includes:
a diode having an anode coupled to the first voltage source and a cathode;
a seventh transistor having a gate coupled to the anode of the diode, a source coupled to the cathode of the diode, and a drain;
an eighth transistor having a gate and a source adapted to be coupled to ground and a source coupled to the cathode of the diode;
a capacitor having a first terminal coupled to the cathode of the diode;
a first current mirror having a first current mirror input coupled to drain of the seventh transistor, and a first current mirror output;
a second current mirror having a second current mirror input coupled to the first current mirror output, and a second current mirror output, the second current mirror adapted to be coupled to a second voltage source; and
a current source coupled between the second current mirror output and ground, the second current mirror output coupled to the third transistor.

13. The apparatus of claim 12, wherein the capacitor has a second terminal and the ramp detector includes a third current mirror having a third current mirror input coupled to the second terminal of the capacitor, and a third current mirror output coupled to the second current mirror input.

14. The apparatus of claim 9, wherein the voltage source is a first voltage source, and the ramp detector includes:
a capacitor having a first terminal adapted to be coupled to the first voltage source, and a second terminal;
a first current mirror having a first current mirror input coupled to the second terminal of the capacitor, and a first current mirror output;
a second current mirror having a second current mirror input coupled to the first current mirror output, and a second current mirror output, the second current mirror adapted to be coupled to the second voltage source; and
a current source coupled between the second current mirror output and ground, the second current mirror output coupled to the third transistor.

15. A system, comprising:
a first component having a first component input, the first component configured to operate in a first voltage domain defined according to a first voltage source;
a second component having a second component output, the second component configured to operate in a second voltage domain defined according to a second voltage source; and
a level shifter, comprising:
a ramp detector configured to:
detect a slew rate of the first voltage source;
determine whether the slew rate of the first voltage source exceeds a programmed amount; and
provide an output signal having an asserted value responsive to the slew rate of the first voltage source exceeding the programmed amount; and
a level-shifting circuit having a level-shifting circuit input coupled to the second component output and a level-shifting circuit output coupled to the first component input, the level-shifting circuit also coupled to the first voltage source and the ramp detector, and the level-shifting circuit configured to:
convert a signal provided by the second component from the second voltage domain to the first voltage domain and provide the signal according to the second voltage domain to the first component;
limit a quiescent current of the level-shifting circuit via a current choke while the slew rate of the first voltage source does not exceed the programmed amount; and
bypass the current choke responsive to the output signal having the asserted value.

16. The system of claim 15, wherein the current choke is a first current choke, and the level-shifting circuit includes:
a first arm that includes a first transistor that is a first portion of a cross-coupled latch, a second transistor, the first current choke, a third transistor, and a first diode-coupled transistor stack; and
a second arm that includes a fourth transistor that is a second portion of the cross-coupled latch, a fifth transistor, a second current choke, a sixth transistor, and a second diode-coupled transistor stack.

17. The system of claim 16, wherein the first transistor has a source adapted to be coupled to the voltage source, the fourth transistor has a source adapted to be coupled to the voltage source, a gate coupled to a drain of the first transistor, and a drain coupled to a gate of the first transistor, the second transistor has a drain coupled to the drain of the first transistor, the fifth transistor has a drain coupled to the drain of the fourth transistor, the first current choke is adapted to be coupled between a source of the second transistor and ground, the second current choke is adapted to be coupled between the source of the fifth transistor and ground, the third transistor has a drain coupled to the source of the second transistor and a source adapted to be coupled to ground, the sixth transistor has a drain coupled to the source of the fifth transistor and a source adapted to be coupled to ground, and the third transistor and the sixth transistor are each configured to receive a signal that has an asserted value responsive to a slew rate of the voltage source exceeding a programmed amount, the asserted value being sufficient to cause the third transistor and the sixth transistor to conduct current to bypass the first current choke and the second current choke.

18. The system of claim 16, wherein the voltage source is a first voltage source, and the ramp detector includes:
a diode having an anode coupled to the first voltage source and a cathode;
a seventh transistor having a gate coupled to the anode of the diode, a source coupled to the cathode of the diode, and a drain;
an eighth transistor having a gate and a source adapted to be coupled to ground and a source coupled to the cathode of the diode;
a capacitor having a first terminal coupled to the cathode of the diode;

a first current mirror having a first current mirror input coupled to drain of the seventh transistor, and a first current mirror output;

a second current mirror having a second current mirror input coupled to the first current mirror output, and a second current mirror output, the second current mirror adapted to be coupled to the second voltage source; and a current source coupled between the second current mirror output and ground, the second current mirror output coupled to the third transistor.

19. The system of claim 18, wherein the capacitor has a second terminal and the ramp detector includes a third current mirror having a third current mirror input coupled to the second terminal of the capacitor and a third current mirror output coupled to the second current mirror input.

20. The system of claim 16, wherein the voltage source is a first voltage source, and the ramp detector includes:

a capacitor having a first terminal adapted to be coupled to the first voltage source, and a second terminal;

a first current mirror having a first current mirror input coupled to the second terminal of the capacitor, and a first current mirror output;

a second current mirror having a second current mirror input coupled to the first current mirror output, and a second current mirror output, the second current mirror adapted to be coupled to the second voltage source; and a current source coupled between the second current mirror output and ground, the second current mirror output coupled to the third transistor.

21. An apparatus, comprising:

a level-shifting circuit having:

a first arm including a first portion of a cross-coupled latch, a first diode-coupled transistor stack, and a first input transistor;

a second arm including a second portion of the cross-coupled latch, a second diode-coupled transistor stack, and a second input transistor;

a first current choke adapted to be coupled between the first input transistor and ground;

a second current choke adapted to be coupled between the second input transistor and ground;

a first shorting transistor adapted to be coupled across the first current choke between the first input transistor and ground; and a second shorting transistor adapted to be coupled across the second current choke between the second input transistor and ground; and a ramp detector having capacitor coupled via a current mirror to the first shorting transistor and the second shorting transistor, the ramp detector also having a grounded gate transistor coupled to the capacitor.

* * * * *